US007606327B2

(12) United States Patent
Walker et al.

(10) Patent No.: US 7,606,327 B2
(45) Date of Patent: Oct. 20, 2009

(54) METHOD TO RECEIVE LOCAL INFORMATION WITH A NATIONAL BROADCAST SERVICE

(75) Inventors: Glenn A. Walker, Greentown, IN (US); Mark A. Pollard, Greentown, IN (US); Duane E. Mateychuk, Westfield, IN (US)

(73) Assignee: Delphi Technologies, Inc., Troy, MI (US)

( * ) Notice: Subject to any disclaimer, the term of this patent is extended or adjusted under 35 U.S.C. 154(b) by 721 days.

(21) Appl. No.: 10/628,822

(22) Filed: Jul. 28, 2003

(65) Prior Publication Data

US 2005/0025089 A1 Feb. 3, 2005

(51) Int. Cl.
*H03K 9/00* (2006.01)

(52) U.S. Cl. ........................ 375/316; 375/132; 375/133; 375/134; 375/135; 375/136; 370/330; 370/478; 370/132; 370/328; 370/329; 455/3.01; 455/3.02; 455/3.03; 455/3.04; 455/3.05

(58) Field of Classification Search ................. 370/323, 370/334, 316, 330, 478, 132, 328, 329, 335–338, 370/340–342; 710/38; 455/3.01, 3.02, 3.03, 455/3.04, 7, 427, 428, 12.1, 181.1, 171.1, 455/178.1, 186, 191.1, 456.1, 457, 414.1, 455/161.2, 161.3, 166.2, 184.1, 419, 345, 455/3.06, 556, 186.1, 193.1, 193.2, 132, 455/184, 187, 456.3, 20, 74, 18, 66, 45, 6.3, 455/4.1, 4.2, 103; 375/132–137
See application file for complete search history.

(56) References Cited

U.S. PATENT DOCUMENTS 4,392,247 A * 7/1983 van Deursen ............ 455/161.2
5,404,566 A * 4/1995 Wehrmeyer ................ 455/3.06
5,548,828 A * 8/1996 Kozaki et al. ............ 455/161.2
5,701,161 A * 12/1997 Williams et al. ............ 348/468
5,732,338 A * 3/1998 Schwob ................... 455/158.5

(Continued)

*Primary Examiner*—Chieh M Fan
*Assistant Examiner*—Siu M Lee
(74) *Attorney, Agent, or Firm*—Jimmy L. Funke

(57) ABSTRACT

A receiver is disclosed. The receiver includes a first antenna, a second antenna, a system controller, a national broadcast demodulator, a local broadcast demodulator, and an information output select device. The first antenna for receives a signal from a satellite that contains information of national interest. The second antenna receives a signal from a land-based transmitter that contains information of local interest. The national broadcast demodulator is coupled to the first antenna and the system controller. The national broadcast demodulator provides a first interrupt indicator to the system controller. The local broadcast demodulator is coupled to the second antenna and the system controller. The local broadcast demodulator provides a second interrupt indicator to the system controller. Upon receiving either the first or second interrupt indicator at the system controller, the system controller switches the information output select device between the national broadcast information and the local broadcast information. A method for providing a seamless transition between national broadcast information and local broadcast information for a receiver is also disclosed. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims. 37 CFR 1.72(b).

7 Claims, 6 Drawing Sheets

U.S. PATENT DOCUMENTS

| | | | | |
|---|---|---|---|---|
| 5,797,087 | A * | 8/1998 | Lee | 455/181.1 |
| 5,819,166 | A * | 10/1998 | Kimura et al. | 455/186.1 |
| 5,950,112 | A * | 9/1999 | Hori et al. | 725/148 |
| 5,969,634 | A * | 10/1999 | Takashima et al. | 340/7.34 |
| 6,006,076 | A * | 12/1999 | Nakamura | 455/186.1 |
| 6,122,493 | A * | 9/2000 | Kobayashi et al. | 455/193.1 |
| 6,163,683 | A * | 12/2000 | Dunn et al. | 455/151.1 |
| 6,181,921 | B1 * | 1/2001 | Konisi et al. | 455/186.2 |
| 6,347,216 | B1 * | 2/2002 | Marko et al. | 455/12.1 |
| 6,397,141 | B1 | 5/2002 | Binnig | |
| 6,526,268 | B1 | 2/2003 | Marrah et al. | |
| 6,628,930 | B1 * | 9/2003 | Vogt et al. | 455/131 |
| 6,741,834 | B1 * | 5/2004 | Godwin | 455/3.01 |
| 6,795,413 | B1 * | 9/2004 | Uhlik | 370/330 |
| 6,829,475 | B1 * | 12/2004 | Lee et al. | 455/419 |
| 6,980,769 | B2 * | 12/2005 | Toporski | 455/3.01 |
| 7,054,601 | B2 * | 5/2006 | Heiderscheit et al. | 455/179.1 |
| 7,065,333 | B2 * | 6/2006 | Engstrom | 455/184.1 |
| 2001/0004587 | A1 * | 6/2001 | Lee | 455/403 |
| 2002/0058475 | A1 * | 5/2002 | Patsiokas | 455/3.02 |
| 2002/0099882 | A1 * | 7/2002 | Denda et al. | 710/38 |
| 2003/0014767 | A1 * | 1/2003 | Stumphauzer, II | 725/131 |
| 2003/0040272 | A1 * | 2/2003 | Lelievre et al. | 455/3.06 |
| 2003/0054758 | A1 * | 3/2003 | Kawamata et al. | 455/3.04 |
| 2004/0121748 | A1 * | 6/2004 | Glaza | 455/151.1 |
| 2004/0192189 | A1 * | 9/2004 | Yuhara et al. | 455/3.02 |
| 2004/0198389 | A1 * | 10/2004 | Alcock et al. | 455/456.1 |

* cited by examiner

METHOD TO RECEIVE LOCAL INFORMATION WITH A NATIONAL BROADCAST SERVICE

TECHNICAL FIELD

The present invention generally relates to receivers and, more particularly, to an apparatus and method for providing a seamless transition between national broadcast information and local broadcast information for a receiver.

BACKGROUND OF THE INVENTION

Automotive vehicles are commonly equipped with audio radios for receiving broadcast radio frequency (RF) signals, processing the RF signals, and broadcasting audio information to passengers in the vehicle. More recently, satellite digital audio radio (SDAR) services have become available. SDAR services offer digital radio service covering a large geographic area, such as North America. Satellite-based digital audio radio services are available in North America, which generally employ either geo-stationary orbit satellites or highly elliptical orbit satellites that receive uplinked programming which, in turn, is rebroadcast directly to digital radios in vehicles on the ground that subscribe to the service. These systems also use terrestrial repeater networks in urban areas to supplement the availability of service. Each vehicle subscribing to the digital service generally includes a digital radio having a receiver and one or more antennas for receiving the digital broadcast.

The radio receivers are programmed to receive and unscramble the digital data signals, which typically include many channels of digital audio. In addition to broadcasting the encoded digital quality audio signals, the satellite-based digital audio radio service may also transmit data within a data bandwidth that may be used for various applications. The broadcast signal may also include other information for reasons such as advertising, informing the driver of warranty issues, providing information about the broadcast audio information, and providing news, sports, and entertainment broadcasting. Accordingly, the digital broadcast may be employed for any of a number of satellite audio radio, satellite television, satellite Internet, and various other consumer services.

In current satellite-based digital audio radio services, the same data stream is generally broadcast to all users of the service over a large geographic area covering multiple cities, states and countries. With the adoption of the consumer services broadcast, the ability to acquire local (i.e. regional) information such as local news, weather, traffic information, and the like has become problematic. For example, a gap exists in the ability of a national service provider to optimally supply local content (i.e. a region-wide broadcast), and, conversely, a gap exists in the ability of a local service provider to optimally supply national content (i.e. a nation-wide broadcast). Each local and national provider contains information that the user wants, however, each provider differs in broadcast channels (i.e. frequency modulation and coverage area). Even further, each provider differs in broadcast time. For example, news and weather may be broadcast at different times in an unsynchronized system; in this case, to switch from one broadcast source to the other may cause the end user to experience an abrupt change (i.e. the user may be listening to a song from a national broadcast and the system abruptly switches over to a local news update in the middle of a song. This of course undesirably detracts from the user listening experience.

To enable more subscribers to national broadcast systems without undesirable interruptions, a method is needed to give the end user local information without sacrificing bandwidth (i.e. the amount of broadcast data that is used by the largest number of potential users). Because each system has a fixed amount of broadcast data (number of bits), it is desired to maximize the efficiency of the data (i.e. bandwidth). For the national provider to supply local content (for many locations), the national provider would be using bandwidth that is only applicable to a smaller number of users in a region-specific area (i.e. the national broadcaster would have to allocate local programming content in their data stream for east coast, mid-west, and west-coast cities).

The associated problem occurs with the amount of bandwidth available to the national broadcaster, which essentially results in less data available for national use. To support many local broadcasts, the national service provider would have to eliminate national programs to accommodate the extra bandwidth for local content. Accordingly, the national broadcaster either loses programming content, which may result in the availability of fewer national programs or lost advertising time. In view of this, the local broadcaster, conversely, cannot compete with the national broadcaster on the amount of content that can be provided (i.e. the national broadcaster has a bandwidth advantage such that the national broadcaster may send 100 channels of various programming content, whereas the local broadcaster may be limited to 1 channel). Therefore, because the national system targets listeners for subscriptions, potential advertising revenue may be lost if there isn't a need to buy the subscription service if diverse programming transmitted over a large number of channels are not available, such that the national content is not undesirably interrupted with typically free local content.

Accordingly, it is therefore desirable to optimize the local and national method of broadcast for bandwidth and programming content for revenue stream such that service providers may acquire as many listeners as possible for their programming content (i.e. data bandwidth). In particular, it is desirable to provide the maximum amount of national content, such that the national content data is not diluted with local information, while also allowing the local content provider to provide local information. It is also desirable to allow the local provider a tie in to the national broadcaster such that the local provider obtains listener time even though the primary content is subscription content provided by the national provider.

SUMMARY OF THE INVENTION

The present invention relates to a receiver. Accordingly, one embodiment of the invention is directed to a receiver that includes a first antenna, a second antenna, a system controller, a national broadcast demodulator, a local broadcast demodulator, and an information output select device. The first antenna for receives a signal from a satellite that contains information of national interest. The second antenna receives a signal from a land-based transmitter that contains information of local interest. The national broadcast demodulator is coupled to the first antenna and the system controller. The national broadcast demodulator provides a first interrupt indicator to the system controller. The local broadcast demodulator is coupled to the second antenna and the system controller. The local broadcast demodulator provides a second interrupt indicator to the system controller. Upon receiving either the first or second interrupt indicator at the system controller, the system controller switches the information output select device between the national broadcast information and the local broadcast information.

A method for providing a seamless transition between national broadcast information and local broadcast information for a receiver is also disclosed.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
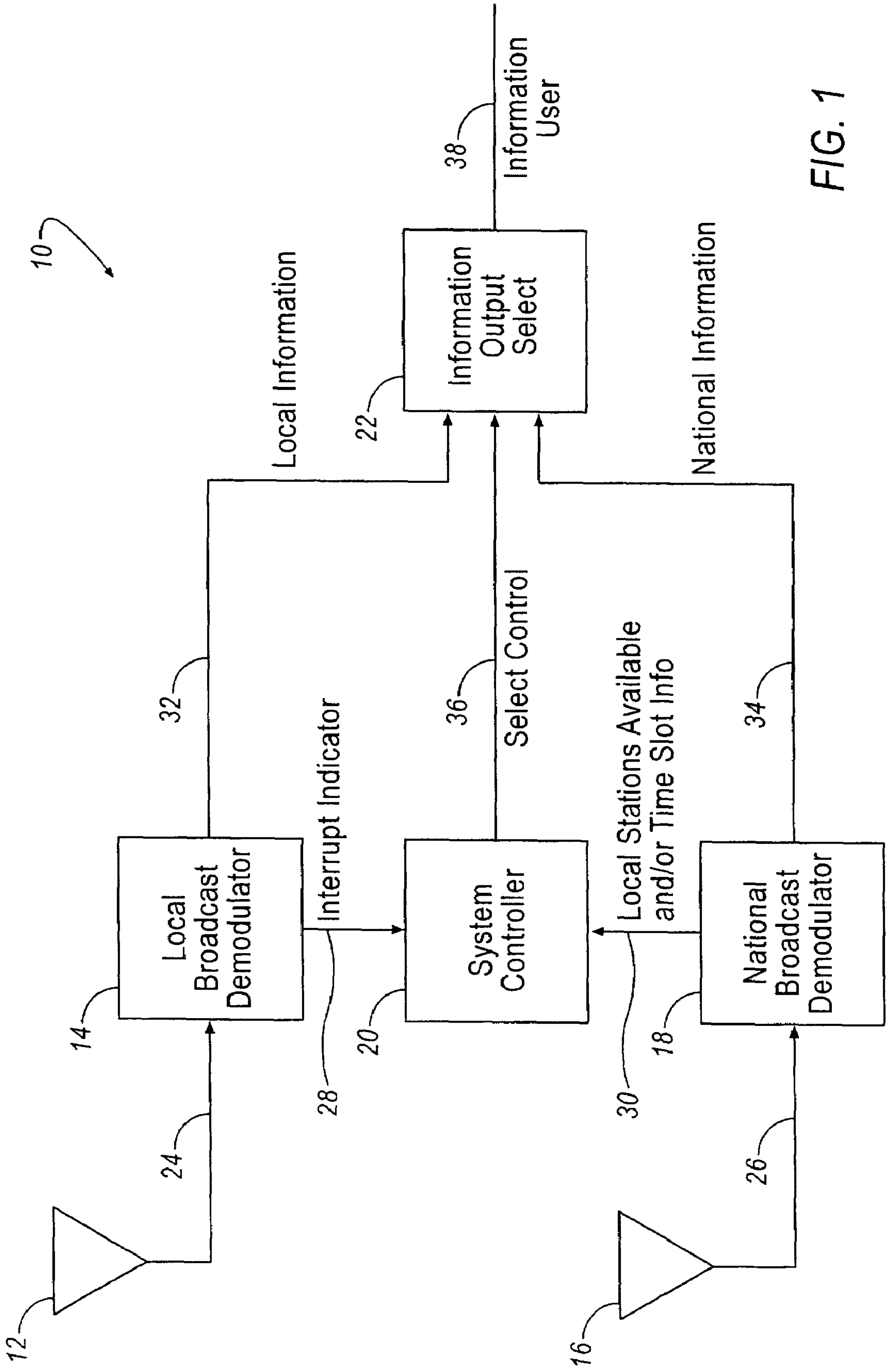
FIG. 1 illustrates a block diagram for a method to receive local information with a national broadcast service according to one embodiment of the invention.

The above described disadvantages are overcome and a number of advantages are realized by the inventive receiver, which is shown generally at 10 in FIG. 1. As explained below, the receiver 10 operates using multiple receiver channels (i.e. two or more complementary antennas) to cover an expected satellite signal from one or more satellites placed in synchronous or non-synchronous earth orbits (and/or the supplemental terrestrial signal). By using one receiver channel for local broadcast and one receiver channel for national broadcast, the receiver 10 can provide audio from the national broadcasts and local broadcasts to the user. As seen in FIG. 1, the multiple receiver channels are seen generally at the antenna 12, which is a 'local broadcast antenna,' and the antenna 16, which is a 'national broadcast antenna.' However, although two antennas 12, 16 are shown, one reconfigurable or broadband antenna may be used such that an associated demodulator properly determines the output information to the user.

Essentially, the receiver 10 permits interruption of a national broadcast by a local broadcast via a time slot indicator method or an interrupt indicator method that allows the user to decide which programming content (i.e. local content or national content) is desired. As seen generally in FIG. 1, a local broadcast demodulator (LBD) 14, which communicates with the antenna 12 over line 24, enables the interrupt indicator method by providing an interrupt signal; a national broadcast demodulator (NBD) 18, which communicates with antenna 16 over line 26, enables the time-slot indicator method by providing a time-slot interrupt signal (this may also be accomplished using GPS time). As illustrated, the LBD 14 provides an interrupt indicator over line 28 to a system controller 20 and the NBD 18 provides time-slot information over line 30 to the system controller 20. The system controller 20 communicates over line 36 with an information output select device 22, which may be a Diverge for Audio (DA) data multiplexer. The local information is communicated over line 32 from the LBD 14 and the national information is communicated over line 34 to the information output select device 22. Accordingly, the system controller 20 permits the information output select device 22 to switch between local and national broadcast information supplied over lines 32, 34, respectively, such that the desired information is communicated to a user over line 38.

In general, the demodulators 14, 18 decode an analog or digitized signal to the data stream level. The demodulators 14, 18 may be similar or different in structure, depending on the desired application. The determining factor of the structure of the demodulators 14, 18 is the broadcast format (i.e. frequency, modulation type, etc.). According to one embodiment of the invention, the receiver 10 may permit the user to select local information only or national information from a radio that includes an AM/FM/SDAR band button to determine what frequency range is being used such that the station is determined by user selection (i.e. a preset button or tune button). However, the receiver 10 also enables the user with the option of automatically switching between local and national services without the user performing the manual selection.

In operation, the receiver 10 keeps track of national 'friendly local stations' (i.e. preferred stations) that are available, which may be enabled via a download from the national broadcaster data stream over the antennas 12, 16 to keep 'unwanted local stations' from interrupting the national service programming content. Essentially, an unwanted station may send a signal that 'spoofs' the receiver 10 into believing that it should change to that signal. A spoof is an undesirable signal, which upon reception at the receiver 10 at the demodulator level, appears to be an expected desirable signal that essentially is corrupted and results in the demodulator believing that the received signal is the expected signal, thus creating an undesirable output, which may be a programming interruption.

Because there are multiple FM stations that use the same frequency, the same FM frequency across a national region may have both "friendly" and "unfriendly" stations, which may result in an accidental spoofed signal occurrence. For example, a user, whose receiver operates in an interrupt-driven mode, may be initially tuned to a friendly station whose broadcast frequency is 97.1 MHz in region A; then, the user may turn on the radio to an unfriendly station in region B whose broadcast frequency is also 97.1 MHz, which results in the unintentional, user-initiated spoofing of the receiver 10. However, more often than not, a spoofed signal is transmitted purposely (when a user is tuned to a friendly station) by the unfriendly station, which may be a hacker, whose desire to interfere with the performance of the receiver 10. Once the unfriendly station captures the attention of the receiver 10, the user's desired programming is undesirably switched over to the unfriendly station's programming, which is more often than not, unsolicited advertising or other programming.

Relating to the embodiment of the invention, the friendly local station may be a regional station that provides complementary programming with the national provider such that the end user receives a seamless transition between local and national broadcasts. The download of information that the receiver 10 obtains includes regional location information with a listing of friendly FM stations, which may be found in a look-up table from a national broadcast service provider that correlates regional, local information with friendly stations. According to one embodiment of the invention, the download is received by the receiver 10 in a data stream from the national broadcast antenna 16, conversely, the download may be received through a radio data service (RDS) system, which are sub-carriers on the FM signal from the local broadcast antenna 12. For example, if the receiver 10 is positioned on a mobile vehicle, such as an automobile, a global positioning signal (GPS) device determines the location of the vehicle and then, upon receiving the location information, the receiver 10 uses the look up table to find the frequency of the friendly stations for the current location that the vehicle is positioned at.

The download of information may be stored in the receiver's microcontroller, which may be located in the system controller 20 that the demodulators 14, 18 communicate with. The download may be performed automatically by the broadcaster at specific predetermined times (e.g. daily, nightly, weekly, monthly, yearly) or randomly after the receiver 10 is activated. If GPS is not available or becomes disabled, a manual input of information may be implemented by the user such that the user informs the receiver 10 of its geographic location via a user interface (not shown) to enable the receiver 10 to lookup the most recent download of friendly stations correlating to the user-input information, or, to locate friendly stations via the antennas 12, 16 even though the GPS-initiated look up is not available. Preferably, in either scenario, the download is conducted when the vehicle is on. Alternatively, the download may also be performed when the vehicle is off; however, if downloads are performed when the vehicle is off, the vehicle battery may be drained.

Figure 2:
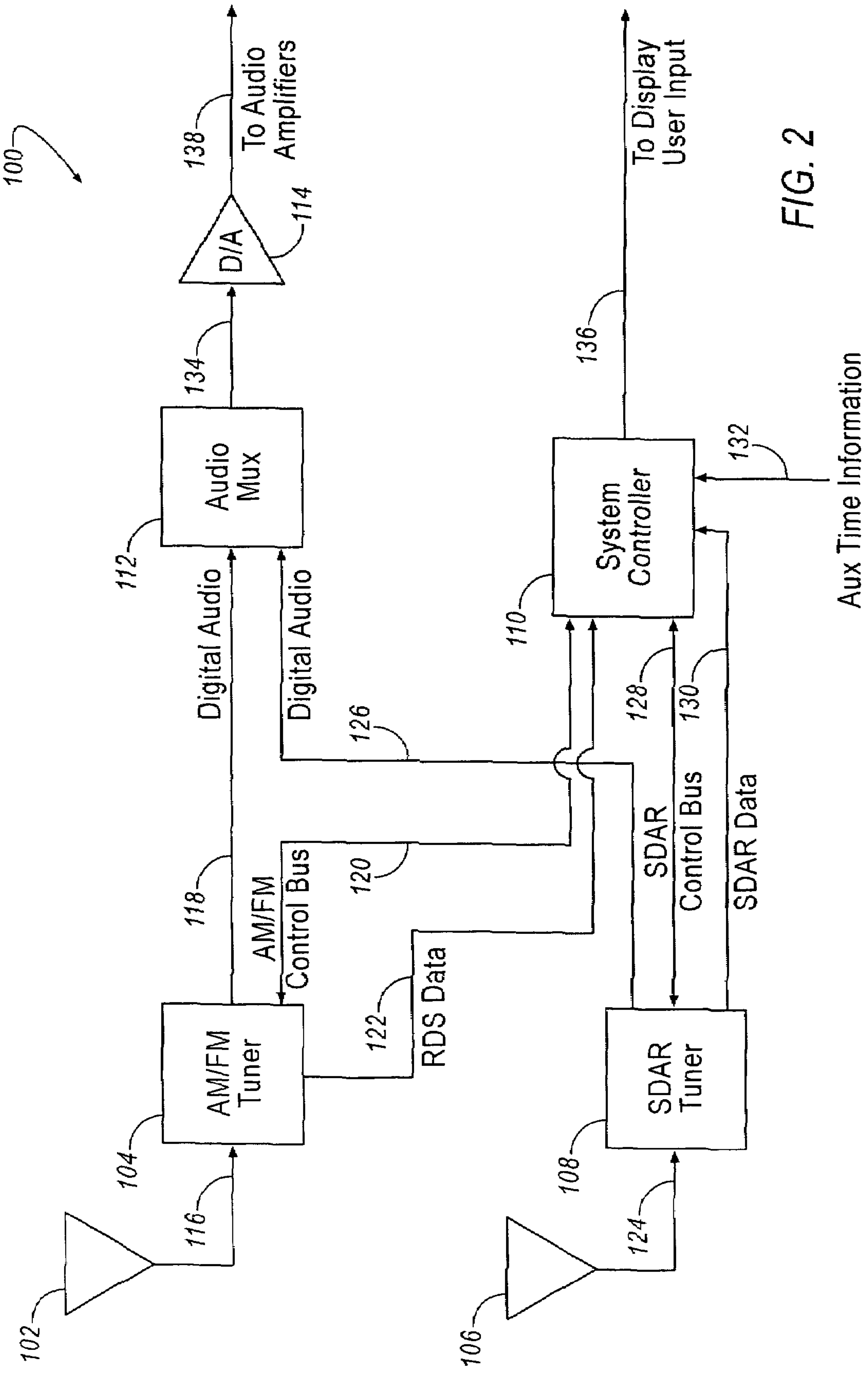
FIG. 2 illustrates a block diagram for a method to receive local information with a national broadcast service according to another embodiment of the invention.

As a result of knowing the available friendly stations, the receiver 10 is able to tune to the local friendly station at the appropriate channel while in the national receive mode. In one possible implementation, when a time-slot interruption occurs, the national broadcast signal may be switched over to the local friendly broadcast signal to provide on-the-hour local news updates. The time-slot interruption provides a switched interruption of the national broadcast for X minutes, where X may be any desirable amount of time, such as, for example, 10 seconds, 1, 2, 3, 5, 10 or more minutes. Even further, the user may also have the option of disabling the local switch-over feature by pressing a button on the user interface that communicates with the system controller 20 to instantly return to the national broadcast if the local information that is time-slot interrupting the national information is not desired. When the receiver 10 switches over from the national broadcaster to the local broadcaster, the national broadcaster may provide any desired programming, such as national news or advertising, so that if the user decides to stay in tune with the national broadcaster, the user may alternatively listen to the national news or advertising provided by the national broadcaster rather than the local content, such as local news provided by the local broadcaster. Generally, the time-slot information 30 may be associated with nationally broadcast information because, according to another embodiment of the invention as seen in FIG. 2, SDAR services include timing information. That is, if the timing information is provided with the SDAR signal, the receiver 10 needs predetermined switching information correlated with the SDAR signal to know when to switch over. Essentially, by synchronizing the time between the local and national broadcast, the receiver 10 may be programmed to switch between the two channels at time intervals.

The time synchronization of the signals may be determined at the service provider level where the programming content is synchronized in time (e.g. news on the hour) because, typically, the local and national provider start their news broadcast at the same time. This allows the local broadcast to provide timed local information while the national broadcast channel provides national information while allowing the user to choose what programming information they desire to listen to. As also seen in FIG. 1, the local broadcast demodulator 14 provides an interrupt indicator signal at 28. According to the embodiment illustrated in FIG. 2, a predefined indicator signal sequence (e.g. an RDS data signal, a series of tones on the audio channel, an analog signal, or a digital signal) is provided with the local broadcast, thus, permitting the receiver 10 to know when to switch from the national broadcast to the local broadcast. Regardless if a time-slot or interrupt indicator is used, the system controller 20 switches after detection of the predefined indicator or time-slot signal. By use of an interrupt indicator signal, the receiver system is able to provide more urgent (time critical) information to the receiver (i.e. weather, traffic, emergency).

Referring now to FIG. 2, one possible alternative implementation of the receiver 10 as described in FIG. 1 is seen generally at 100. The receiver 100 generally operates by receiving AM/FM signals at an antenna 102 while also receiving SDAR service signals at antenna 106. The signals are respectively communicated over lines 116, 124 to respective tuners (i.e. demodulators) seen at 104, 108. Digital audio is communicated from the tuners 104, 108 over lines 118, 126 to an audio multiplexer 112. The signal output from the audio multiplexer 112 is communicated over line 134 to a digital-to-analog converter 114 such that the converted signal is communicated over line 138 to audio amplifiers.

RDS data (i.e. interrupt data) is communicated from the AM/FM Tuner 104 over line 122 to the system controller 110. SDAR data (i.e. time-slot data) is communicated over line 130 to the system controller 110. Two-way control bus communication paths are provided at lines 120, 128 such that the tuners 104, 108 may communicate with the system controller 110. Auxiliary time information may be communicated to the system controller 110 over line 132. In a local/national system that does not have inherent timing information in either broadcast, the auxiliary time from a GPS system could be used instead. The signal output from the system controller 110 is communicated over line 136 to display for the user, such as a user interface.

Figure 3:
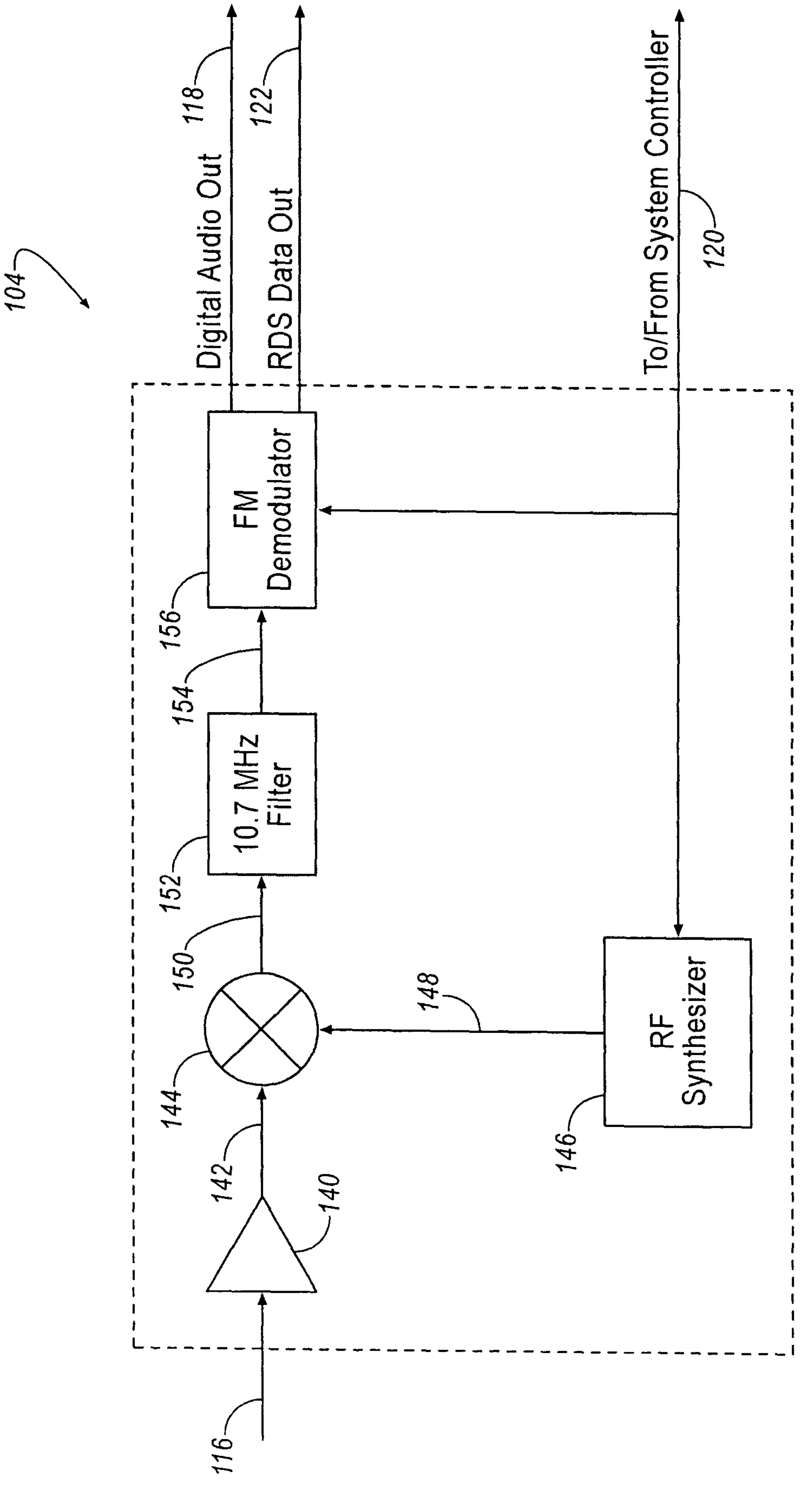
FIG. 3 illustrates an AM/FM tuner block according to the block diagram of FIG. 2.

Referring now to FIG. 3, the AM/FM Tuner 104 is seen in greater detail. The signal provided over line 116 is received by an amplifier 140, which then sends the signal over line 142 to a mixer 144. Frequency and other control information from the system controller 120 is communicated over line 120 and is sent to an RF synthesizer 146 and FM demodulator 156. The signal output by the RF synthesizer 146 is communicated over line 148 to the mixer 144. The signal output from the mixer 144 is communicated over line 150 and is input to a 10.7 MHz Filter 152, the output of which is communicated over line 156 to the FM demodulator 156. As seen in the Figure, the output of the FM demodulator 156 is the digital audio over line 118 and the RDS data over line 122.

Figure 4:
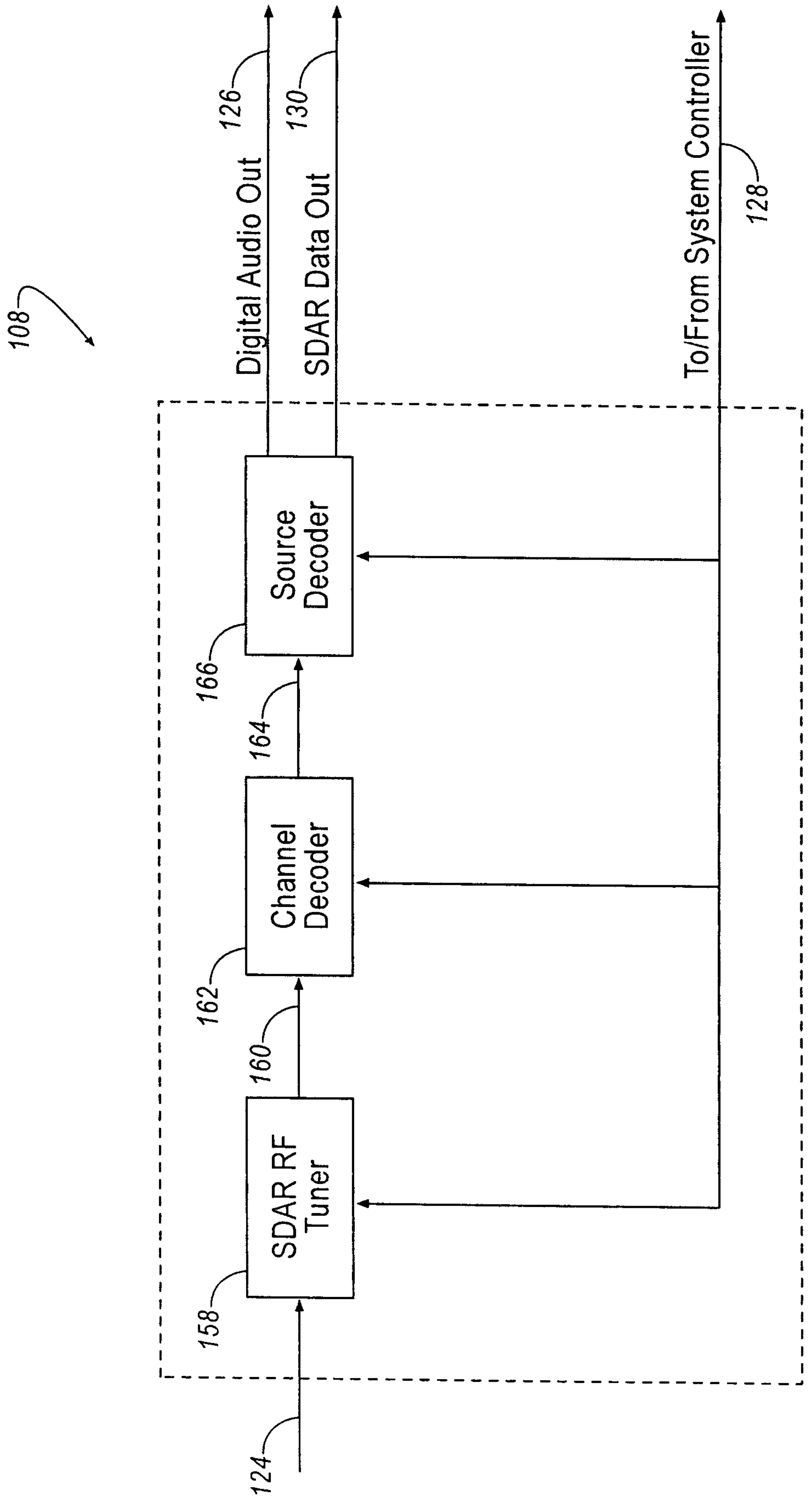
FIG. 4 illustrates an SDAR tuner block according to the block diagram of FIG. 2.

Referring now to FIG. 4, the SDAR Tuner 108 is seen in greater detail. The signal provided over line 124 is received by an SDAR RF Tuner 158. System control information used to control which broadcast channel to use, any system optimization parameters, or status information from the system controller 120 is communicated over line 128 and is sent to the SDAR RF Tuner 158, a Channel Decoder 162, and a Source Decoder 166. The signal output by the SDAR RF Tuner 158 is communicated over line 160 to the channel decoder 162, the output of which is communicated over line 164 to the source decoder 166. As seen in the Figure, the output of the Source Decoder 166 is the digital audio over line 126 and the SDAR data over line 130.

Figure 5:
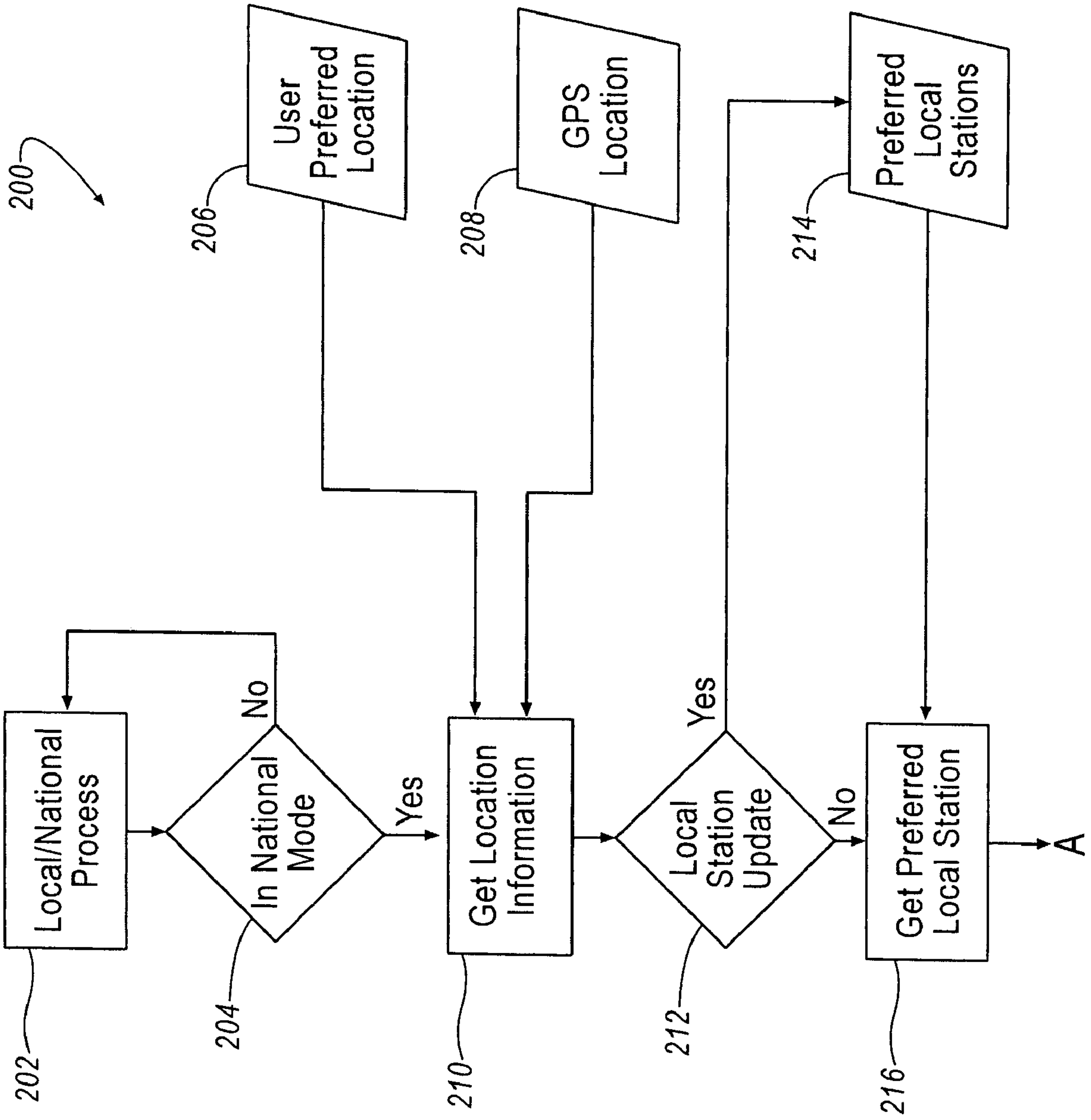
FIGS. 5 and 6 illustrate a flow diagram routine performed by a system controller that operates the method according to the embodiments illustrated in FIGS. 1 and 2.
Figure 6:
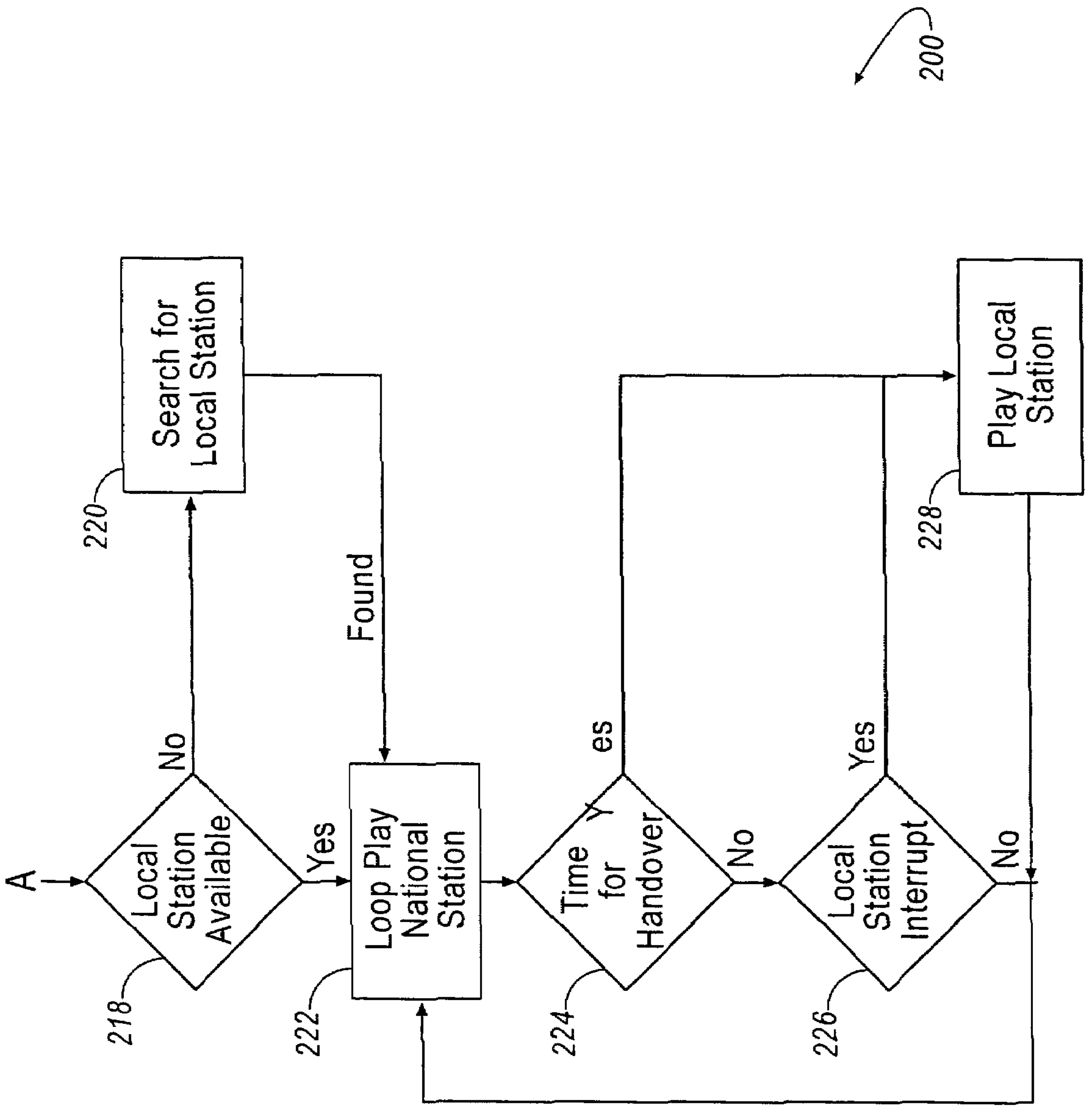

A routine performed by the system controller 20, 110 that operates the receivers 10, 100 is shown generally in FIGS. 5 and 6 at 200. Routine 200 begins at step 202 and checks for the mode setting (i.e. national information mode or local information mode) in decision step 204 to determine if the receiver 10, 100 is in the national mode setting. Upon determining if the receiver 10, 100 is in the national mode setting, location information is gathered from either the user at step 206 or from the a GPS signal at step 208. Once the location information is gathered at step 210, the receiver 10, 100 determines if a local station update is needed if the receiver 10, 100 is located in a new geographic region. If in a new region, the preferred (i.e. friendly) local station information is gathered at step 214 and returned at step 216. If a local station update is not needed, step 214 is obviated and the process is advanced to step 216 and the receiver 10, 100 operates on the current local station information stored therein. Upon choosing a desired local station, the availability of the desired local station is determined at step 218. If not found, a search is performed for the desired local station or another available local station at step 220. Upon finding the desired local station or other selected local station, playing of the national broadcast is initiated at step 222. National play is constantly looped while being monitored for a time-slot interrupt at step 224 or a signal interrupt at step 226. If no interrupt is found, loop play of the national broadcast continues. If an interrupt is found either at step 224 or 226, the local station is played at step 228.

The present invention has been described with reference to certain exemplary embodiments thereof. However, it will be readily apparent to those skilled in the art that it is possible to embody the invention in specific forms other than those of the exemplary embodiments described above. This may be done without departing from the spirit of the invention. The exemplary embodiments are merely illustrative and should not be considered restrictive in any way. The scope of the invention is defined by the appended claims and their equivalents, rather than by the preceding description.

What is claimed is:

1. A method of operating a receiver capable of playing a local broadcast signal and a national broadcast signal for providing a seamless transition between national broadcast information and local broadcast information by the receiver, said method comprising the steps of:

determining if the receiver is set to a national information mode setting or a local information mode setting by the receiver;

upon determining when the national mode setting is detected, gathering location information of the receiver;

downloading an available plurality of preferred local stations to the receiver that correlate to the gathered location information;

choosing a local station from the plurality of preferred local stations;

determining the availability of the chosen local station and, if not available, searching for the chosen local station or for another available local station chosen from the plurality of preferred local stations, to select the local broadcast signal for playing by the receiver;

playing of the national broadcast signal by the receiver:

monitoring for a time-slot interrupt within the national broadcast signal and a signal interrupt within the local broadcast signal, by the receiver;

detecting the time-slot interrupt or the signal interrupt by the receiver for interrupting the national broadcast signal; and if either the time-slot interrupt or the signal interrupt is present, initiating the playing of the local broadcast signal by the receiver.

2. The method according to claim 1, wherein, prior to the downloading step, determining if the receiver is in need of a preferred local station update in view of the gathered location information.

3. The method according to claim 1, wherein the downloading step is performed randomly by a national broadcaster service provider.

4. The method according to claim 1, wherein the downloading step is performed at specific predetermined times.

5. The method according to claim 1, wherein the downloading step is performed when the receiver is activated.

6. The method according to claim 1, wherein the gathering location information of the receiver is conducted via a GPS signal.

7. The method according to claim 1, wherein the gathering location information of the receiver is conducted via a manual user input of the receiver's geographic location.

* * * * *